United States Patent
Tu et al.

(10) Patent No.: US 6,521,881 B2
(45) Date of Patent: Feb. 18, 2003

(54) STACKED STRUCTURE OF AN IMAGE SENSOR AND METHOD FOR MANUFACTURING THE SAME

(75) Inventors: Hsiu Wen Tu, Hsinchu Hsien (TW); Wen Chuan Chen, Hsinchu Hsien (TW); Mon Nan Ho, Hsinchu Hsien (TW); Li Huan Chen, Hsinchu Hsien (TW); Jichen Wu, Hsinchu Hsien (TW); Meng Ru Tsai, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 0 days.

(21) Appl. No.: 09/836,160

(22) Filed: Apr. 16, 2001

(65) Prior Publication Data

US 2002/0148946 A1 Oct. 17, 2002

(51) Int. Cl.⁷ .............................................. H01L 27/00
(52) U.S. Cl. ...................... 250/208.1; 250/239; 257/686
(58) Field of Search ............................. 250/208.1, 239, 250/216, 551; 257/680, 678, 685–686, 713, 98–100, 777, 723, 783, 787, 431–434; 438/64, 109, 116

(56) References Cited

U.S. PATENT DOCUMENTS

| | | | | |
|---|---|---|---|---|
| 4,807,021 A | * | 2/1989 | Okumura | 257/738 |
| 5,952,714 A | * | 9/1999 | Sano et al. | 257/680 |
| 5,973,337 A | * | 10/1999 | Knapp et al. | 257/99 |
| 6,049,074 A | * | 4/2000 | Endo et al. | 250/208.1 |

* cited by examiner

Primary Examiner—Kevin Pyo
Assistant Examiner—Seung C. Sohn
(74) Attorney, Agent, or Firm—Pro-Techtor International Services

(57) ABSTRACT

A stacked structure of an image sensor includes a substrate, an integrated circuit, a package layer, an image sensing chip, and a transparent layer. The integrated circuit is formed on the substrate and electrically connected to the substrate. The package layer covers the integrated circuit. The image sensing chip is placed on the package layer to form the stacked structure with the integrated circuit and is electrically connected to the substrate. The transparent layer is arranged above the image sensing chip for the image sensing chip to receive image signals via the transparent layer. According to this structure, the image sensing chip and the integrated circuit can be integrally stacked easily.

15 Claims, 2 Drawing Sheets

STACKED STRUCTURE OF AN IMAGE SENSOR AND METHOD FOR MANUFACTURING THE SAME

BACKGROUND OF THE INVENTION

1. Field of the Invention

The invention relates to a stacked structure of an image sensor and the method for manufacturing the same, and in particular, to a structure and method in which image sensing chips and integrated circuits having various functions are packaged in a package body, so as to lower the number of the package substrates and integrally package the image sensing chip and the processing units having various functions.

2. Description of the Related Art

A general sensor is used for sensing signals that may be optical signals or audio signals. The sensor of the invention is used for receiving image signals and converting the image signals into electrical signals that are to be transmitted to the printed circuit board.

A general image sensor is used for receiving image signals and for converting the image signals into electrical signals that are to be transmitted to the printed circuit board. The image sensor is further electrically connected to other integrated circuits in order to possess various functions. For example, the image sensor may be electrically connected to a digital signal processor which is used for processing the signals generated by the image sensor. Furthermore the image sensor may be electrically connected to a micro controller or a central processing unit to possess various functions.

However, a conventional image sensor is individually packaged. Thus, various integrated circuits mating with the image sensor have to be individually packaged with the image sensor. The packaged image sensor and various integrated circuits are then electrically connected to the printed circuit board via a plurality of wirings. In this structure, a substrate and a package body have to be used when individually packaging each of the integrated circuits and the image sensor, causing the manufacturing costs cannot be effectively lowered. Furthermore, when mounting each of the integrated circuits onto the printed circuit board, the required area of the printed circuit board is relatively large. Thus, the products cannot be made thin, small, and light.

To solve the above-mentioned problems, it is necessary for the inventor to provide a stacked structure of an image sensor and method for manufacturing the same.

SUMMARY OF THE INVENTION

It is therefore an object of the invention to provide a stacked structure of an image sensor and method for manufacturing the same, so as to decrease the number of package elements and lower the package costs.

It is therefore another object of the invention to provide a stacked structure of an image sensor and method for manufacturing the same, so as to simplify and facilitate the manufacturing processes.

It is still another object of the invention to provide a stacked structure of an image sensor and method for manufacturing the same, which is capable of reducing the area of an image sensing product.

It is still another object of the invention to provide a stacked structure of an image sensor and method for manufacturing the same, which is capable of lowering the package costs and testing costs of the image sensing products.

According to one aspect of the invention, a stacked structure of an image sensor which is electrically connected to a printed circuit board includes a substrate, an integrated circuit, a package layer, an image sensing chip, and a transparent layer. The substrate has an upper surface and a lower surface opposite to the upper surface. The upper surface is formed with a plurality of signal input terminals while the lower surface is formed with a plurality of signal output terminals for electrically connecting to the printed circuit board. The integrated circuit is arranged on the upper surface of the substrate and electrically connected to the signal input terminals. The package layer covers the integrated circuit to package the integrated circuit. The image sensing chip is arranged on the package layer to stack above the integrated circuit and is electrically connected to the signal input terminals of the substrate. The transparent layer covers the image sensing chip, wherein image signals passing through the transparent layer are received by the image sensing chip. A method for manufacturing the image sensor is also disclosed. According to this structure, the image sensing chip and the integrated circuit can be integrally stacked easily.

DETAILED DESCRIPTION OF THE INVENTION

Figure 1:
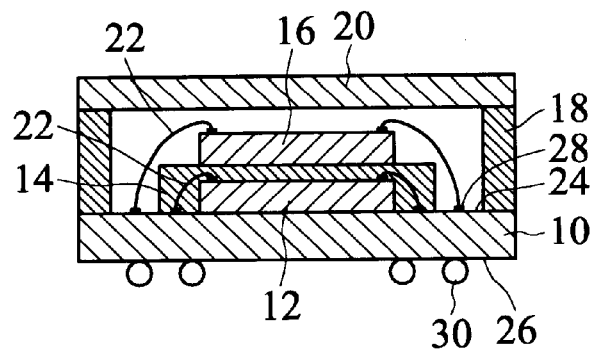
FIG. 1 is a cross-sectional view showing a stacked structure of the image sensor in accordance with the first embodiment of the invention.

Referring to FIG. 1, the stacked structure of the image sensor includes a substrate 10, an integrated circuit 12, a package layer 14, an image sensing chip 16, a frame 18, a transparent layer 20, and a plurality of wirings 22.

The substrate 10 includes an upper surface 24 and a lower surface 26 opposite to the upper surface 24. A plurality of signal input terminals 28 are formed on the upper surface 24 while a plurality of signal output terminals 30 are formed on the lower surface 26. The signal output terminals 30 are used for electrically connecting to a printed circuit board (not shown) and may be metallic balls arranged in the form of a ball grid array.

The integrated circuit 12 may be a digital signal processor, a micro processor, or a central processing unit. The integrated circuit 12 are arranged on the upper surface 24 of the substrate 10 and are electrically connected to the signal input terminals 28 via a plurality of wirings 22. Thus, the signals from the integrated circuit 12 can be transmitted to the substrate 10.

The package layer 14 covers the integrated circuit 12 by way of press molding. The package layer 14 is used for packing and protecting the integrated circuit 12 and the plurality of wirings 22. Therefore, the wirings 22 are free from being pressed and damaged by the image sensing chip 16 when the image sensing chip 16 is stacked above the integrated circuit 12.

The image sensing chip 16 is arranged on the package layer 14 so as to form a stacked structure with the integrated circuit 12. The image sensing chip 16 is electrically connected to the signal input terminals 28 of the substrate 10 via the wirings 22.

The transparent layer 20, which may be a piece of transparent glass, is placed above and covers the image sensing chip 16, so that the image sensing chip 16 may receive image signals passing through the transparent layer 20. In this embodiment, a frame 18 is arranged on the periphery of the upper surface 24 of the substrate 10, and the transparent layer 20 is placed on the frame 18 to cover the image sensing chip 16.

The manufacturing processes of the above-mentioned structure will be described hereinbelow.

Figure 2:
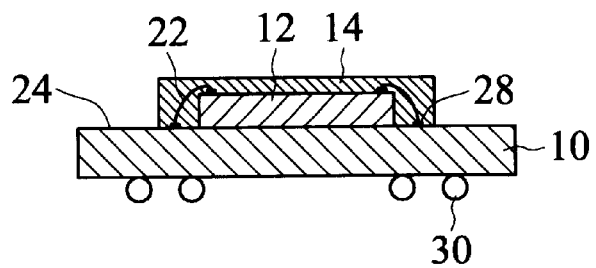
FIG. 2 is a first schematic illustration showing the structure of FIG. 1.

Referring to FIG. 2, first, the integrated circuit 12 is mounted on the upper surface 24 of the substrate 10. Next, the plurality of wirings 22 is used for electrically connecting the integrated circuit 12 to the signal input terminals 28 of the substrate 10. Then, the package layer 14 is used for covering the integrated circuit 12 to protect the integrated circuit 12 and the wirings 22. Subsequently, the frame 18 is placed on the periphery of the upper surface 24 of the substrate 10 for supporting the transparent layer 20 that covers the image sensing chip 16, as shown in FIG. 1.

Figure 3:
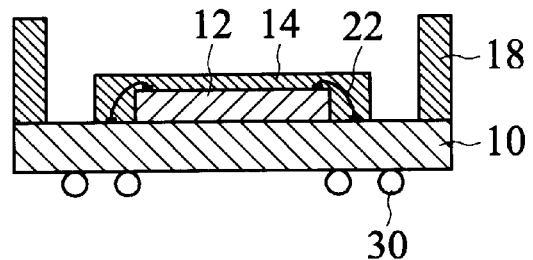
FIG. 3 is a second schematic illustration showing the structure of FIG. 1.

Referring to FIG. 3, after the integrated circuit 12 is placed on the upper surface 24 of the substrate 10 and the substrate 10 is electrically connected to the integrated circuit 12 via the wirings 22, the package layer 14 and the frame 18 may be simultaneously formed on the upper surface 24 of the substrate 10 by way of press molding. The package layer 14 covers the integrated circuit 12 and the wirings 22, and the frame 18 is arranged on the periphery of the substrate 10 for supporting the transparent layer 20. Thus, the manufacturing processes can be simplified and the manufacturing costs can be lowered.

Figure 4:
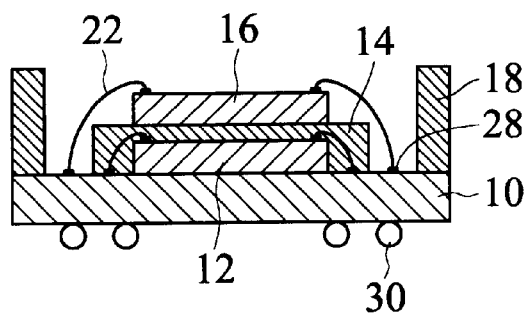
FIG. 4 is a third schematic illustration showing the structure of FIG. 1.

Referring to FIG. 4, the image sensing chip 16 is placed on the package layer 14 and the wirings 22 is electrically connected to the signal input terminals 28 of the substrate 10. Thus, the image sensing chip 16 is stacked above the integrated circuit 12. Referring back to FIG. 1, the transparent layer 20 is mounted on the frame 18 for covering the image sensing chip 16, so that the image sensing chip 16 may receive image signals passing through the transparent layer 20.

Figure 5:
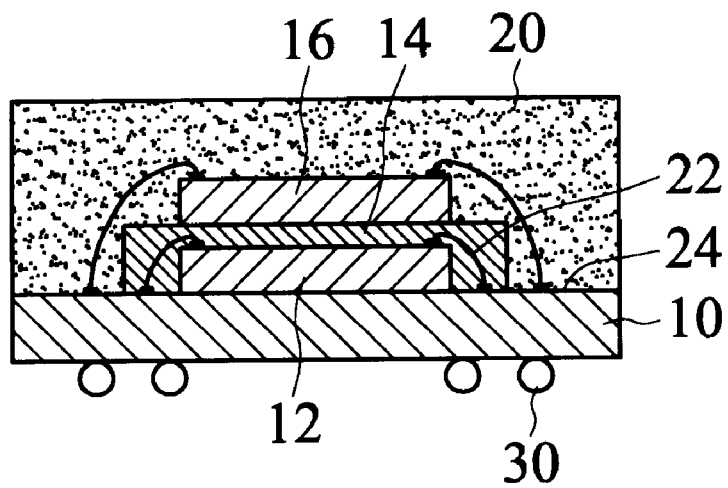
FIG. 5 is a schematic illustration showing the stacked structure of the image sensor in accordance with the second embodiment of the invention.

Referring to FIG. 5, the transparent layer 20 may be a transparent glue. After the integrated circuit 12 and the image sensing chip 16 are stacked above the upper surface 24 of the substrate 10 and electrically connected to the substrate 100 the transparent layer 20 is provided to directly cover the image sensing chip 16, integrated circuit 12, and the wirings 22. Thus, the image sensing chip 16 can receive image signals via the transparent layer 20.

Figure 6:
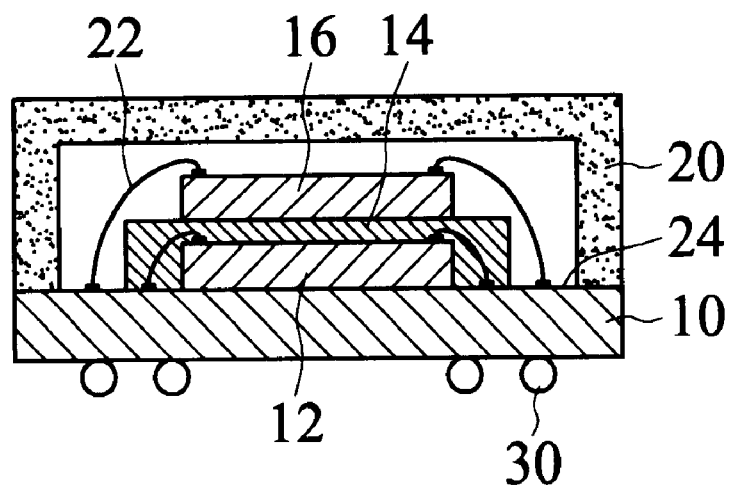
FIG. 6 is a schematic illustration showing the stacked structure of the image sensor in accordance with the third embodiment of the invention.

Referring to FIG. 6, the transparent layer 20 also can be a ⊓-shaped transparent glue, which covers the upper surface 24 of the substrate 10, the image sensing chip 16, the integrated circuit 12, and the wirings 22. Due to the better transparency of the ⊓-shaped transparent glue, image signals with better qualities can be received by the image sensing chip 16.

The stacked structure and manufacturing method in accordance with the embodiments of the invention have the advantages as follows.

1. Since the integrated circuit 12 is covered by the package layer 14, the image sensing chip 16 can be directly placed on the package layer 14 to form a stacked structure with the integrated circuit 12. Thus, the image sensing chip 16 can be stacked above another integrated circuit 12 with an arbitrary size.

2. Since the package layer 14 and the frame 18 of the invention can be simultaneously formed on the substrate 10, the package processes can be further simplified.

While the invention has been described by way of example and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A stacked structure of an image sensor, comprising:
a substrate having an upper surface and a lower surface opposite to the upper surface, the upper surface being formed with a plurality of signal input terminals, the lower surface being formed with a plurality of signal output terminals;
an integrated circuit arranged on the upper surface of the substrate and electrically connected to the signal input terminals;
a package layer covering and contacting the integrated circuit to package the integrated circuit;
an image sensing chip arranged on the package layer to stack above the integrated circuit and electrically connected to the signal input terminals of the substrate; and
a transparent layer covering the image sensing chip, wherein image signals passing through the transparent layer are received by the image sensing chip.

2. The stacked structure of an image sensor according to claim 1, wherein the signal output terminals of the substrate are metallic balls arranged in the form of a ball grid array.

3. The stacked structure of an image sensor according to claim 1, wherein the integrated circuit is electrically connected to the signal input terminals by a plurality of wirings, and the wirings are covered by and in contact with the package layer.

4. The stacked structure of an image sensor according to claim 1, wherein the package layer covers the integrated circuit by way of press molding.

5. The stacked structure of an image sensor according to claim 1, wherein a frame is formed on the periphery of the upper surface of the substrate for surrounding the integrated circuit, the package layer, and the image sensing chip, and the transparent layer is arranged on the frame.

6. The stacked striature of an image sensor according to claim 1, wherein the transparent layer is a transparent glue for covering the integrated circuit, the package layer, and the image sensing chip.

7. The stacked structure of an image sensor according to claim 6, wherein the transparent glue is of ⊓-shape.

8. The stacked structure of an image sensor according to claim 5, wherein the frame and the package layer are simultaneously formed on the upper surface of the substrate.

9. The stacked structure of an image sensor according to claim 1, wherein the integrated circuit is selected from the group consisting of a digital signal processor, a micro processor, and a central processing unit.

10. A method for manufacturing a stacked structure of an image sensor, comprising:

provide a substrate;

arranging an integrated circuit on the substrate and electrically connecting the integrated circuit to the substrate;

covering a package layer on the integrated circuit, the package layer being in contact with the integrated circuit;

providing an image sensing chip on the package layer to form the stacked structure with the integrated circuit; and placing a transparent layer above the image sensing chip for the image sensing chip to receive image signals passing through the transparent layer.

11. The method for manufacturing the stacked structure of the image sensor according to claim 10, wherein a frame is formed on the periphery of the substrate and the transparent layer is placed on the frame.

12. The method for manufacturing the stacked structure of the image sensor according to claim 11, wherein the frame is placed on the substrate after the package layer covers the integrated circuit.

13. The method for manufacturing the stacked structure of the image sensor according to claim 1, wherein the package layer and the frame are simultaneously formed on the substrate.

14. The method for manufacturing the stacked structure of the image sensor according to claim 10, wherein the transparent layer is a transparent glue.

15. The method for manufacturing the stacked structure of the image sensor according to claim 14, wherein the transparent glue is of a ⊓-shape.

* * * * *